(12) United States Patent
Kakimi et al.

(10) Patent No.: US 11,056,866 B2
(45) Date of Patent: Jul. 6, 2021

(54) HOUSING, ELECTRICAL CONNECTION BOX AND WIRE HARNESS

(71) Applicant: YAZAKI CORPORATION, Tokyo (JP)

(72) Inventors: Takaaki Kakimi, Makinohara (JP); Tatsuhiko Ikeda, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 42 days.

(21) Appl. No.: 16/596,730

(22) Filed: Oct. 8, 2019

(65) Prior Publication Data

US 2020/0153213 A1 May 14, 2020

(30) Foreign Application Priority Data

Nov. 12, 2018 (JP) .............................. JP2018-211957

(51) Int. Cl.
*H02G 3/08* (2006.01)
*B60R 16/023* (2006.01)
*H05K 5/02* (2006.01)
*H01R 13/518* (2006.01)
*B60R 16/02* (2006.01)

(52) U.S. Cl.
CPC ......... *H02G 3/081* (2013.01); *B60R 16/0215* (2013.01); *B60R 16/0238* (2013.01); *H01R 13/518* (2013.01); *H02G 3/088* (2013.01); *H05K 5/0221* (2013.01)

(58) Field of Classification Search
CPC .... H02G 3/081; H02G 3/088; B60R 16/0238; B60R 16/0215; H05K 5/0221; H05K 7/026; H01R 13/518
See application file for complete search history.

(56) References Cited

U.S. PATENT DOCUMENTS

| 2012/0006819 | A1* | 1/2012 | Sato | B60R 16/0238 220/200 |
| 2012/0097693 | A1* | 4/2012 | Takeuchi | H02G 3/088 220/810 |
| 2015/0311688 | A1* | 10/2015 | Kakimi | B60R 16/0238 174/562 |
| 2016/0359306 | A1* | 12/2016 | Matsui | H02G 3/083 |
| 2017/0201079 | A1* | 7/2017 | Shiraki | B60R 16/0238 |
| 2017/0207614 | A1* | 7/2017 | Shiraki | H02G 3/081 |
| 2018/0103556 | A1* | 4/2018 | Tashiro | H05K 5/0217 |

FOREIGN PATENT DOCUMENTS

| JP | 2017-108493 A | 6/2017 | |
| WO | WO-2014181656 A1 * | 11/2014 | ......... B60R 16/0238 |

* cited by examiner

*Primary Examiner* — Steven T Sawyer
(74) *Attorney, Agent, or Firm* — Kenealy Vaidya LLP

(57) ABSTRACT

A housing includes a frame having a frame peripheral wall which forms a lower opening, the frame peripheral wall having a frame side seam, and a lower cover having a cover side seam which is engaged with the frame side seam, and configured to cover the lower opening. The lower cover has a first shield wall protruding outward from the cover side seam, and a second shield wall protruding from the first shield wall toward an upper side of the frame. The second shield wall is located outward than a mating surface between the frame side seam and the cover side seam, and a wall inner surface of the second shield wall faces an outer surface of the frame peripheral wall.

7 Claims, 9 Drawing Sheets

HOUSING, ELECTRICAL CONNECTION BOX AND WIRE HARNESS

CROSS REFERENCE TO RELATED APPLICATIONS

This application is based on Japanese Patent Application (No. 2018-211957) filed on Nov. 12, 2018, the contents of which are incorporated herein by reference.

BACKGROUND OF THE INVENTION

1. Field of the Invention

The present invention relates to a housing that includes a frame having a frame side seam and a lower cover having a cover side seam engaged with the frame side seam. The present invention also relates to an electrical connection box or a wire harness that includes the housing and an electronic component block.

2. Background Art

An electrical connection box mounted on an automobile includes an electronic component block and a housing that accommodates the electronic component block. The electronic component block is formed in such a state that a plurality of electronic components are assembled and the electronic components are connected to a predetermined circuit. On the other hand, the housing includes a frame (a box main body) to which the electronic component block is assembled and fixed; an upper cover that covers an upper opening of the frame (an opening that faces the electronic components); and a lower cover that covers a lower opening of the frame.

In the electrical connection box, when the upper opening and the lower opening of the frame are respectively covered by the upper cover and the lower cover, seams of the covers and a seam of the frame are engaged with each other to form a waterproof structure against moisture from the outside (for example, see JP-A-2017-108493). The waterproof structure is formed by the seams being engaged with each other so as to face each other with a small gap as if seam walls are in contact with each other. Therefore, moisture does not reach inside of the electrical connection box when the moisture is applied from the outside of the electrical connection box.

In the related art described above, when moisture is strongly applied to an engagement portion of the seam of the frame and the seam of the lower cover by, for example, high pressure cleaning, the moisture may enter the minute gap. The present inventor believes that there is room for improvement in the waterproof structure.

SUMMARY OF THE INVENTION

The present invention has been made in view of the above circumstances, and an object thereof is to provide a housing capable of enhancing waterproofness. Another object of the present invention is to provide an electrical connection box or a wire harness that includes the housing.

According to a first aspect of the present invention made to solve the above problems, there is provided a box including a frame having a frame peripheral wall which forms a lower opening, wherein the frame peripheral wall has a frame side seam formed at a lower opening side of the frame peripheral wall; and a lower cover having a cover side seam which is engaged with the frame side seam, and configured to cover the lower opening. The lower cover has a first shield wall protruding outward from the cover side seam, and a second shield wall protruding longer than the first shield wall from the first shield wall toward an upper side of the frame. The second shield wall is located outward than a mating surface between the frame side seam and the cover side seam, and a wall inner surface of the second shield wall is formed to face an outer surface of the frame peripheral wall. A groove-shaped or pocket-shaped moisture removal space is formed between the mating surface and the first shield wall.

According to the present invention having the feature of the first aspect, when moisture is applied, for example, at a high pressure, from a lower side toward the engagement portion (the mating surface) between the frame side seam of the frame and the cover side seam of the lower cover, the moisture can be blocked by the first shield wall. When moisture is applied in the same manner from a front surface side of the frame, the moisture can be blocked by the second shield wall. On the other hand, when moisture is applied in the same manner from an upper side of the frame, the moisture may enter a gap between the outer surface of the frame peripheral wall and the wall inner surface of the second shield wall. However, the moisture that enters passes the engagement portion (the mating surface) and falls to the moisture removal space. By adopting a structure in which moisture falls to the moisture removal space, the momentum of the moisture can be weakened. In addition, the moisture is difficult to enter the engagement portion (the mating surface) during falling. Therefore, according to the present invention, waterproofness can be enhanced as compared with the example in related art.

According to a second aspect of the present invention, in the housing according to the first aspect, the moisture removal space has a drain portion communicating with outside of the housing.

According to the present invention having the feature of the second aspect, the moisture that has fallen into the moisture removal space can be drained to the outside of the housing. Therefore, the moisture accumulates and the accumulated moisture can be prevented from entering the engagement portion (the mating surface), so that waterproofness can be further improved.

According to a third aspect of the present invention, in the housing according to the second aspect, the first shield wall has an inclined surface inclined toward the drain portion.

According to the present invention having the feature of the third aspect, in addition to the effect of the second aspect, drainage performance can be improved by the inclined surface.

According to a fourth aspect of the present invention, in the housing according to the first, second or third aspects, a reinforcement rib protruding in a direction in which a thickness of the second shield wall is increased and extending in an extending direction of the second shield wall is formed on the wall inner surface of the second shield wall.

According to the present invention having the feature of the fourth aspect, in addition to the effects of the first, second or third aspects, strength of the second shield wall can be improved. Thereby, the second shield wall can be prevented from being damaged even if moisture is applied to the second shield wall at a high pressure.

According to a fifth aspect of the present invention, in the housing according to the first, second, third or fourth aspects, a lock portion that fits the frame and the lower cover is disposed in vicinity of a portion where the first shield wall, the second shield wall and the moisture removal space are provided.

According to the present invention having the feature of the fifth aspect, waterproofness in vicinity of the lock portion that fits the frame and the lower cover can be enhanced.

According to a sixth aspect of the present invention, there is provided an electrical connection box including: an electronic component block in which a plurality of electronic components are assembled, and the housing according to any one of the first aspect to the sixth aspect that accommodates the electronic component block.

According to the present invention having the feature of the sixth aspect, better electrical connection box can be provided due to the effects of the housing.

According to a seventh aspect of the present invention, there is provided a wire harness body whose end portion is connected to the electrical connection box according to the sixth aspect. The wire harness body is routed in an automobile.

According to the present invention having the feature of the seventh aspect, a better wire harness can be provided due to the electrical connection box having the effects of the housing.

According to the housing of the present invention, since a structure is provided in which the first shield wall, the second shield wall and the moisture removal space are formed, waterproofness can be enhanced as compared with the example in related art. In addition, according to the electrical connection box and the wire harness of the present invention, a better product can be provided due to the housing having the above effects.

DESCRIPTION OF EMBODIMENTS

A wire harness routed in an automobile includes an electrical connection box at a terminal thereof. The electrical connection box includes an electronic component block in which a plurality of electronic components are assembled, and a housing to which the electrical component block is assembled. The housing includes a frame having a frame side seam and a lower cover having a cover side seam engaged with the frame side seam. The lower cover includes a first shield wall protruding shortly outward from the cover side seam and serving as a shield against moisture, and a second shield wall protruding longer than the first shield wall from the first shield wall toward a frame side. The second shield wall is a wall serving as a shield against moisture. The second shield wall is disposed and formed so as to be located outward than a mating surface between the frame side seam and the cover side seam. A wall inner surface is also formed to face an outer surface of a frame peripheral wall. A groove-shaped or pocket-shaped moisture removal space is formed between a position of the mating surface and the first shield wall.

Embodiment

Figure 1:
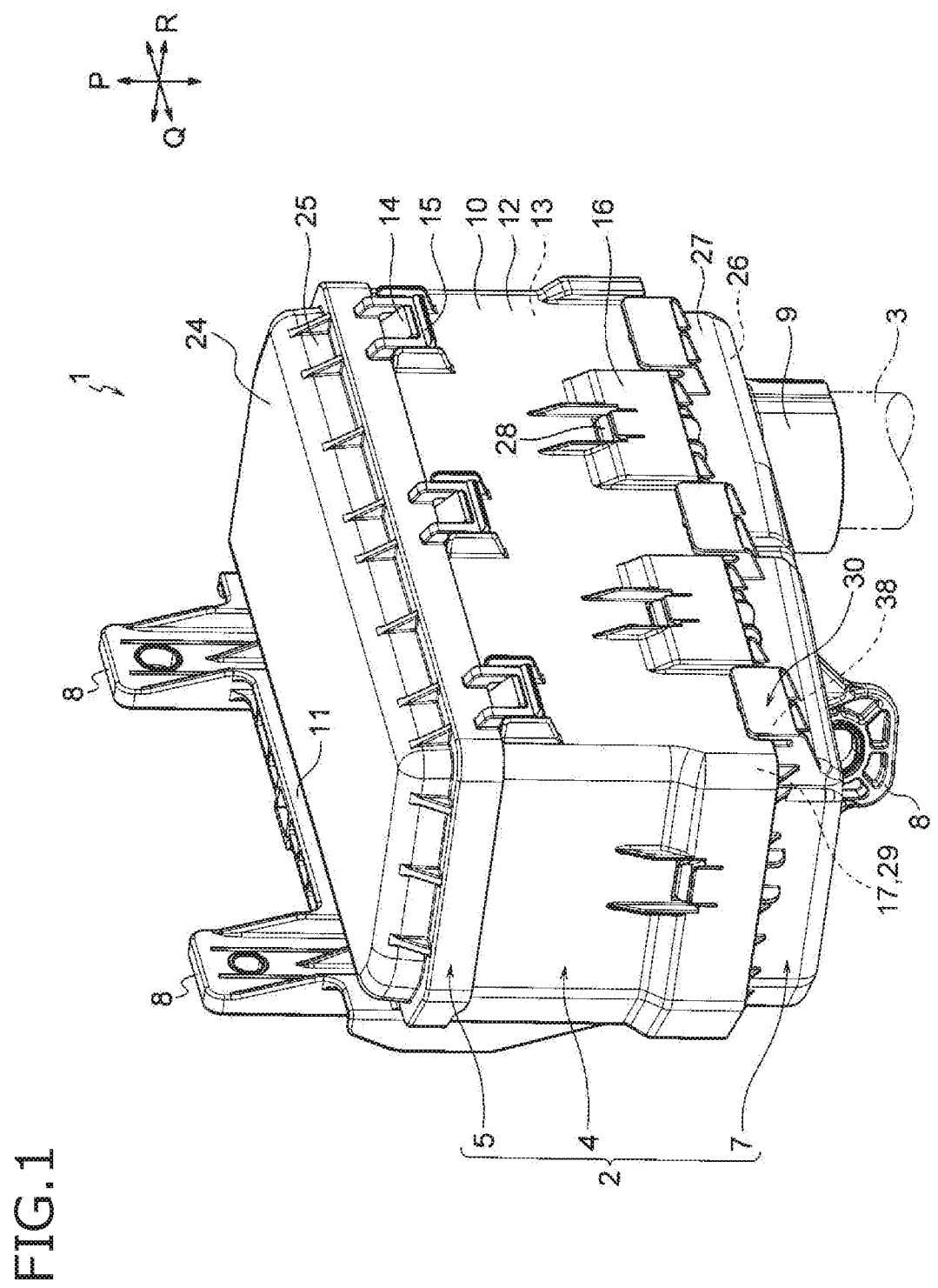
FIG. 1 is a perspective view of an electrical connection box showing an embodiment of a housing according to the present invention.
Figure 2:
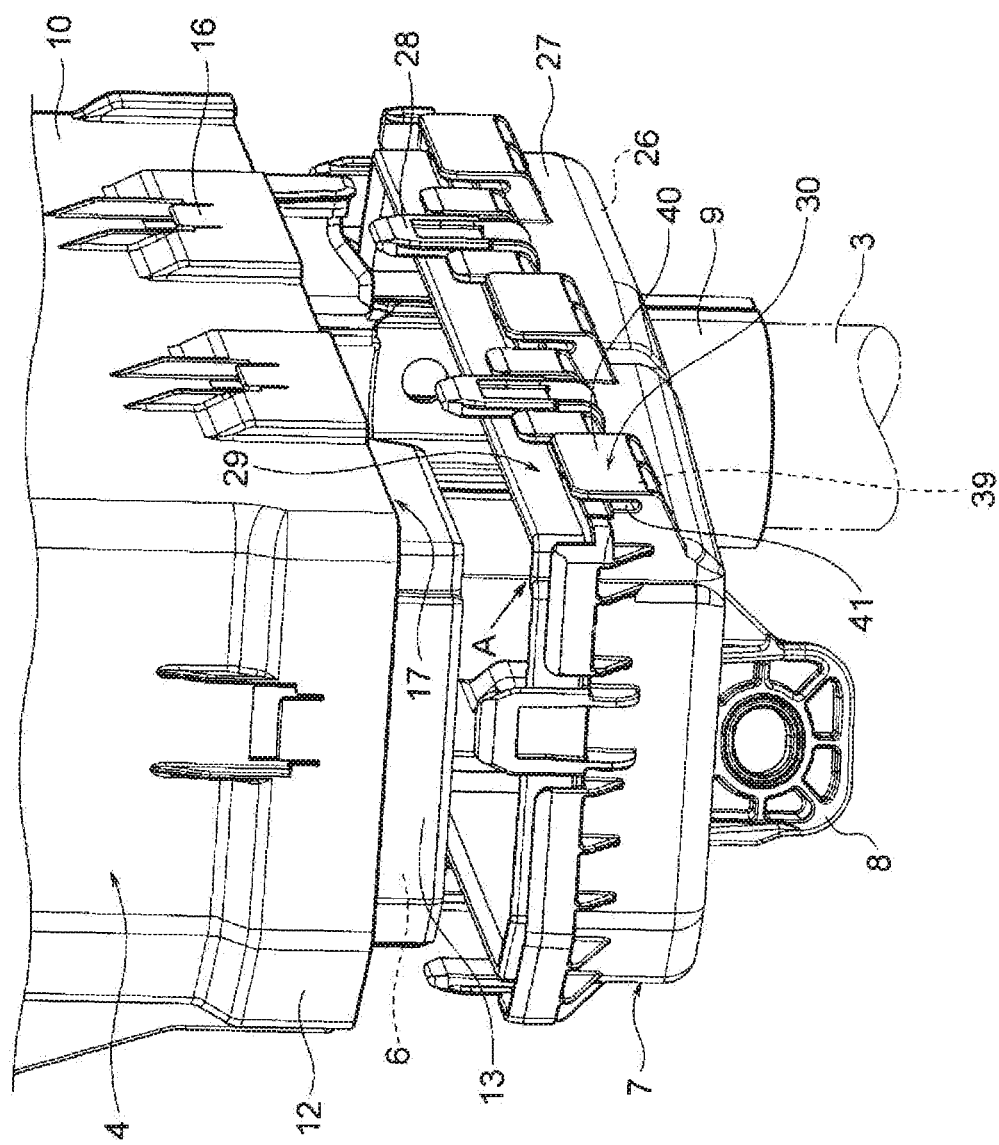
FIG. 2 is an exploded perspective view of a portion of a frame and a lower cover.
Figure 3:
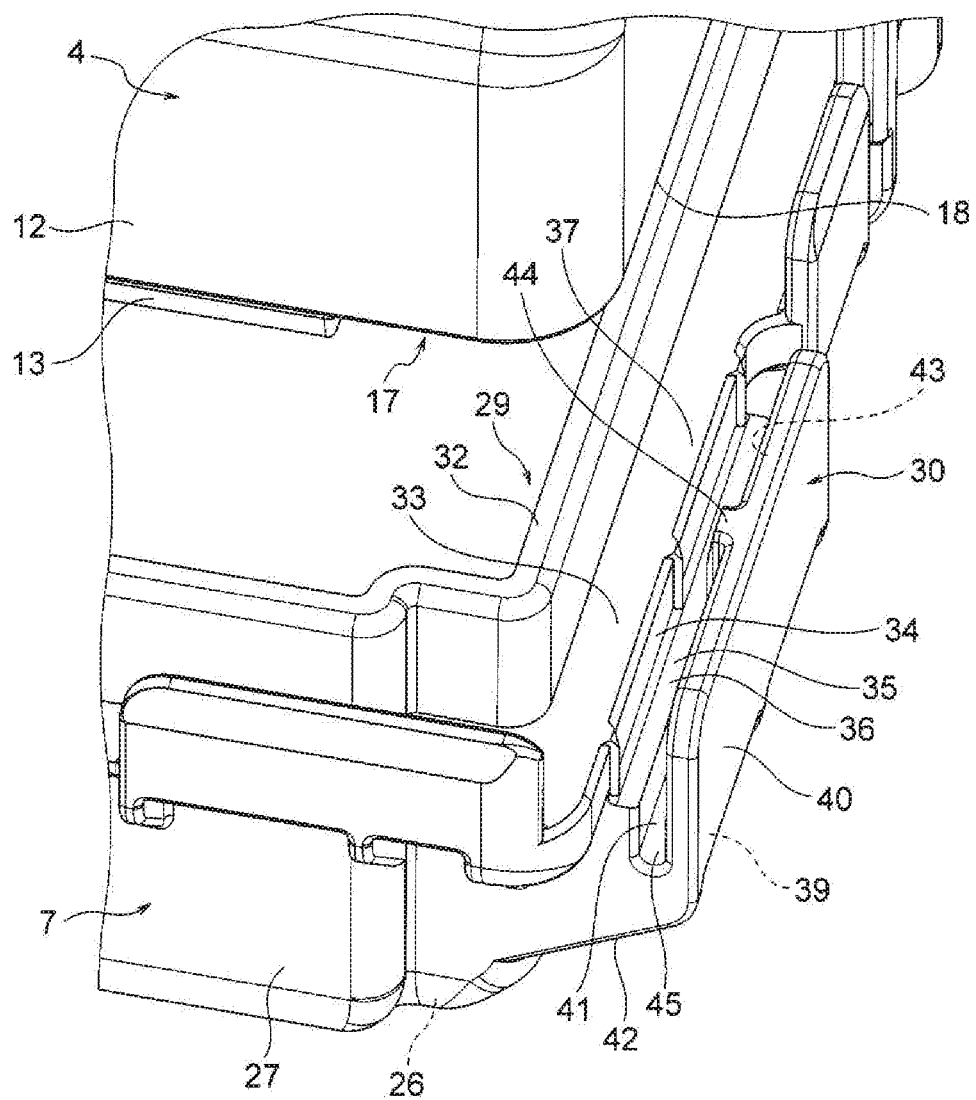
FIG. 3 is an enlarged view of a main portion viewed from an arrow A direction in a state of FIG. 2.
Figure 4:
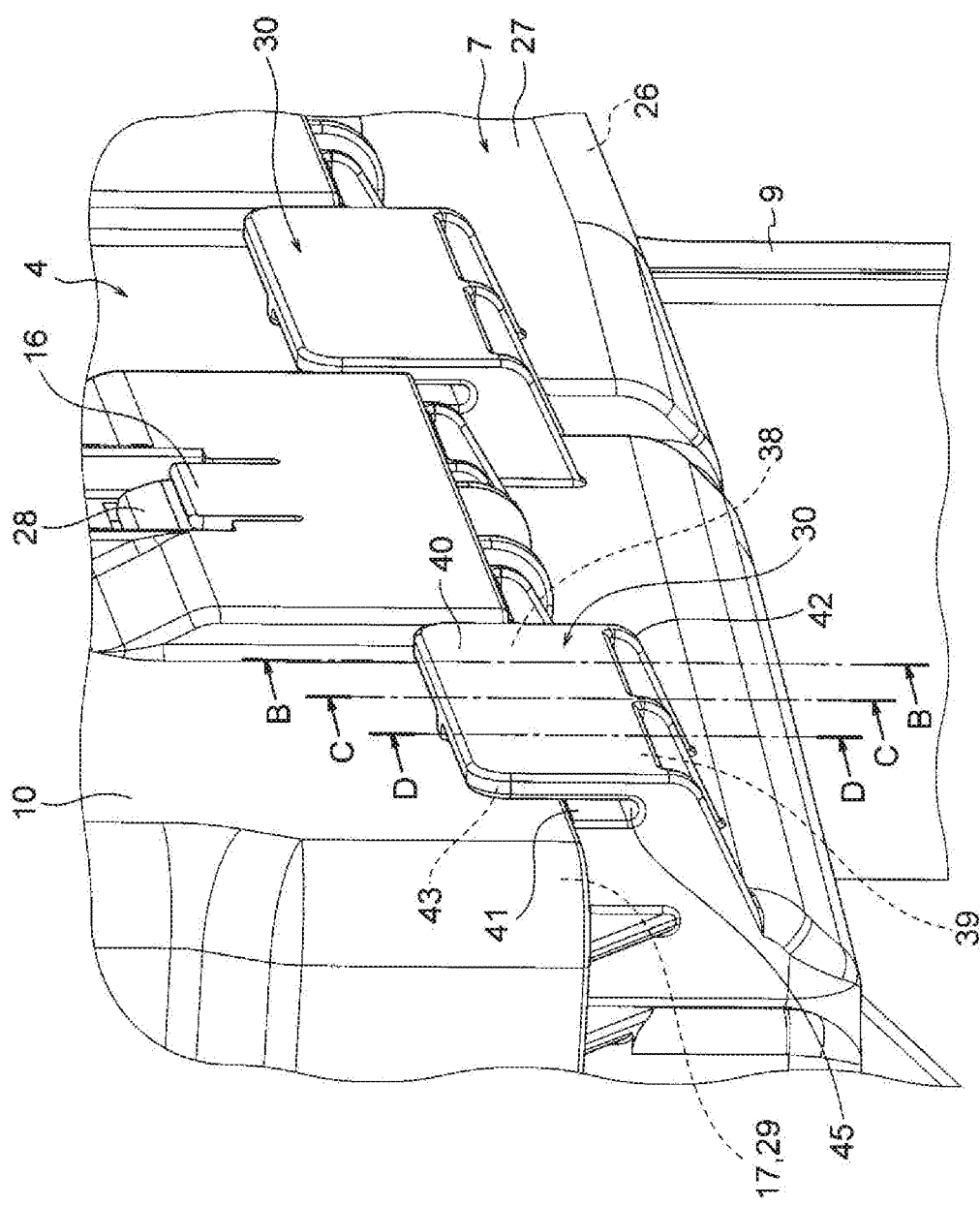
FIG. 4 is an enlarged view of a main portion in a state of FIG. 1.
Figure 5:
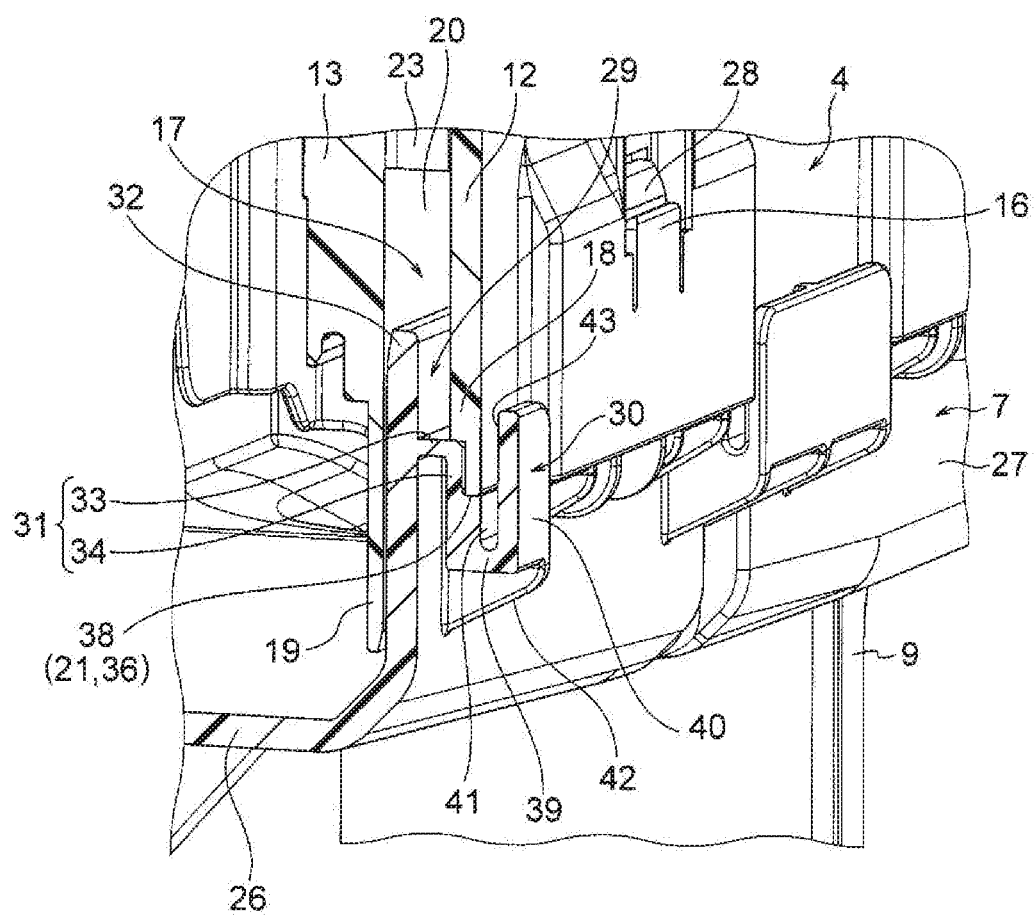
FIG. 5 is a cross-sectional view taken along line B-B in FIG. 4.
Figure 6:
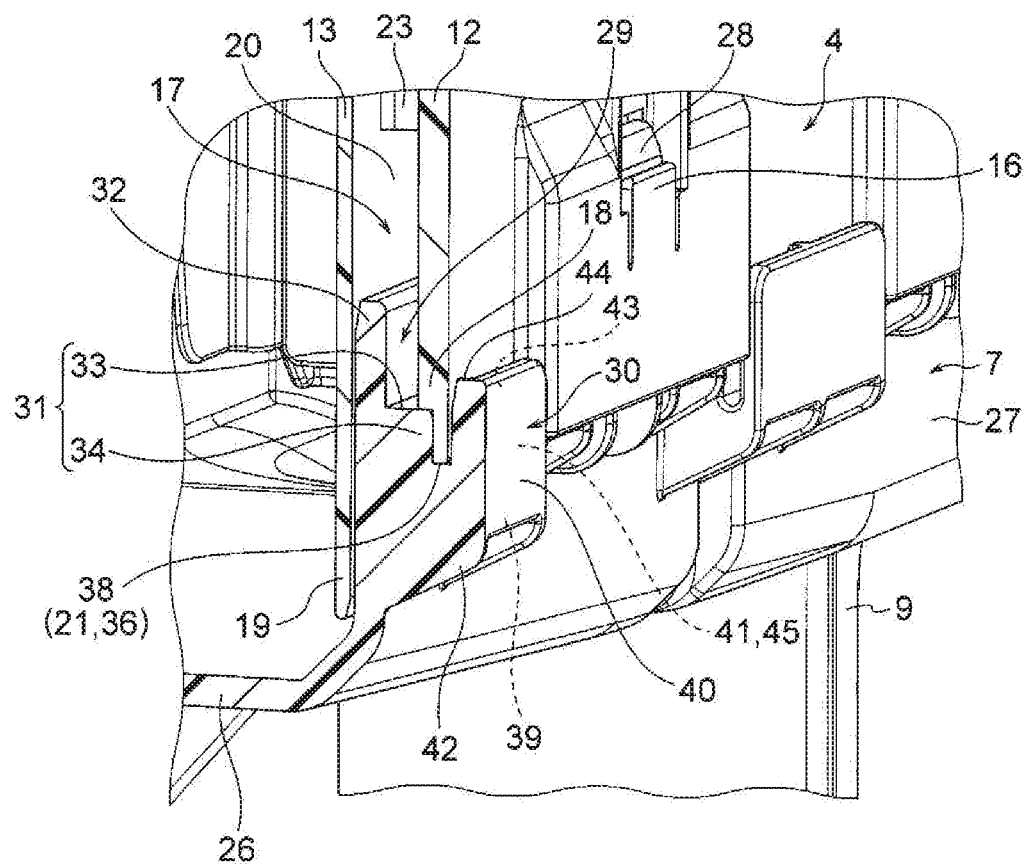
FIG. 6 is a cross-sectional view taken along line C-C in FIG. 4.
Figure 7:
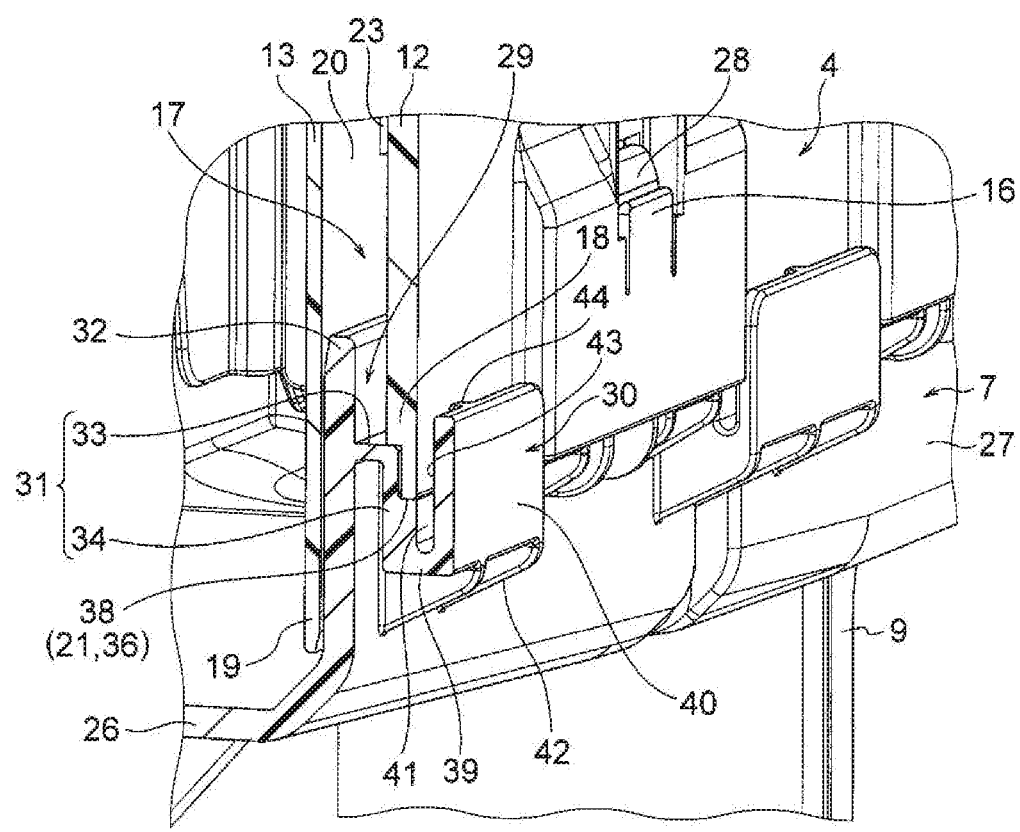
FIG. 7 is a cross-sectional view taken along line D-D in FIG. 4.
Figure 8:
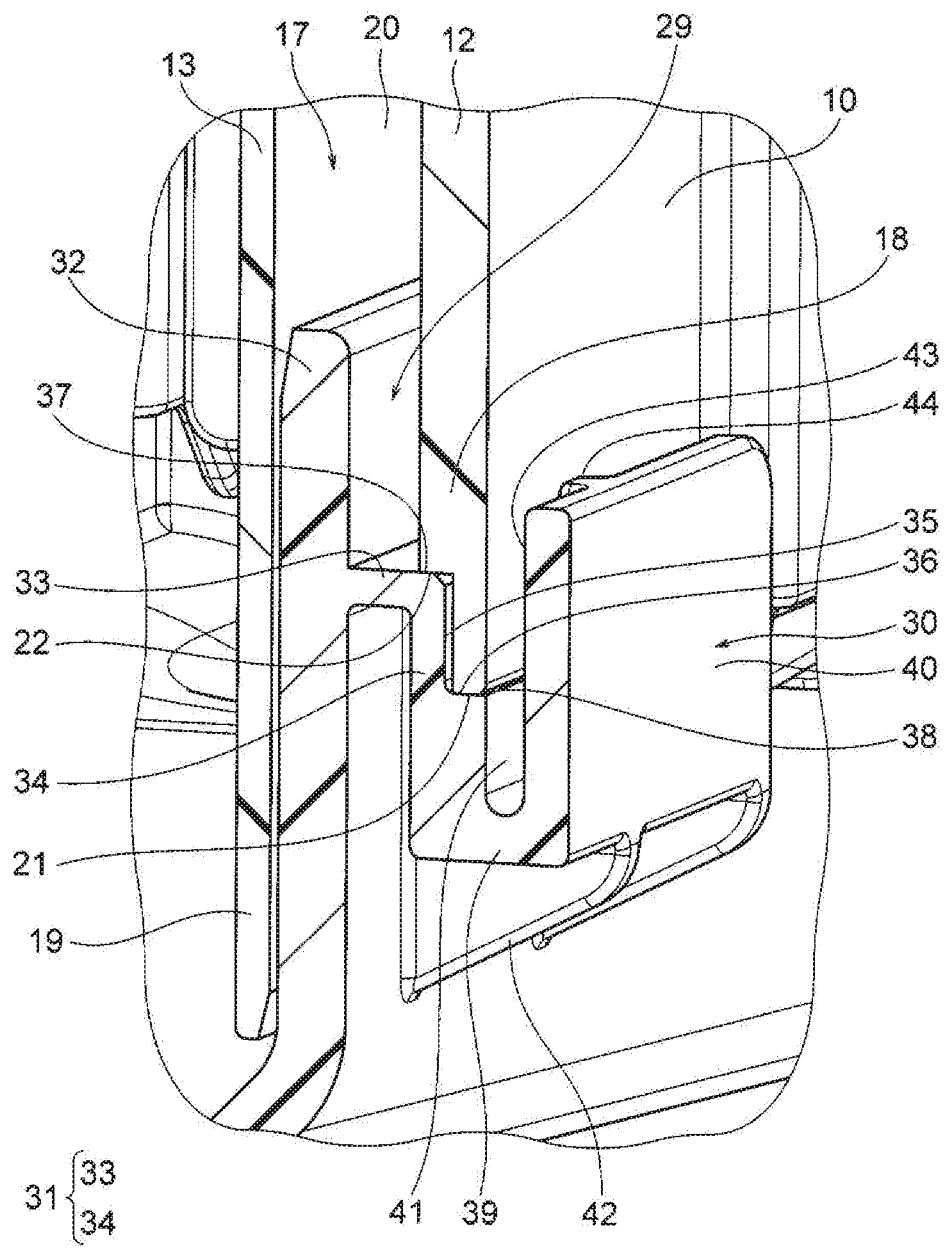
FIG. 8 is an enlarged view of a main portion in a state of FIG. 7.
Figure 9:
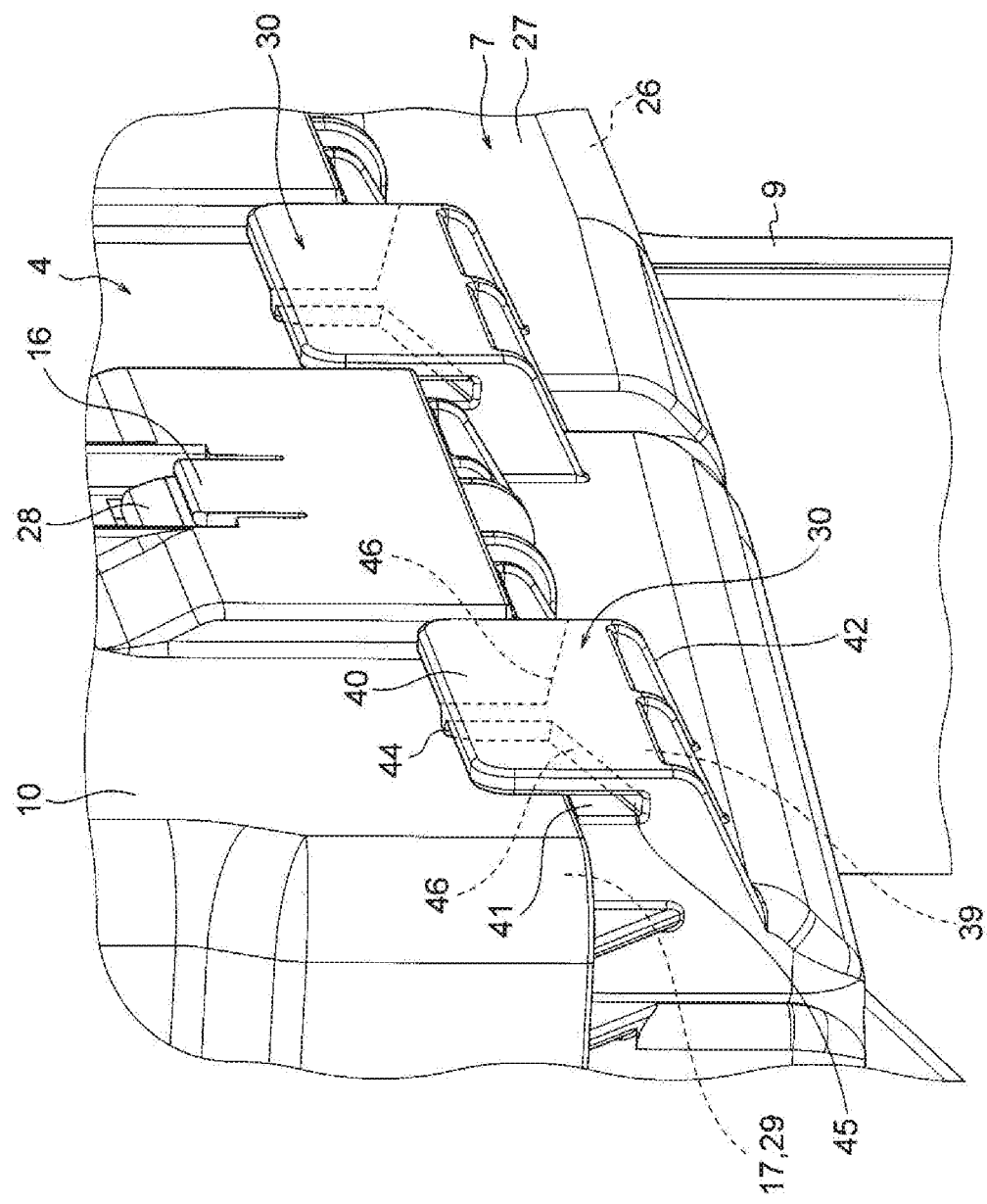
FIG. 9 is a perspective view showing a modification.

An embodiment will be described below with reference to the drawings. FIG. 1 is a perspective view of an electrical connection box showing the embodiment of a housing according to the present invention. FIG. 2 is an exploded perspective view of a portion of a frame and a lower cover. FIG. 3 is an enlarged view of a main portion viewed from an arrow A direction in a state of FIG. 2. FIG. 4 is an enlarged view of a main portion in a state of FIG. 1. FIG. 5 is a cross-sectional view taken along line B-B in FIG. 4. FIG. 6 is a cross-sectional view taken along line C-C in FIG. 4. FIG. 7 is a cross-sectional view taken along line D-D in FIG. 4. FIG. 8 is an enlarged view of a main portion in a state of FIG. 7. FIG. 9 is a perspective view showing a modification. In FIG. 1, arrows P indicate an upper-lower direction, arrows Q indicate a left-right direction, and arrows R indicate a front-rear direction.

<Configuration of Electrical Connection Box 1>

In FIG. 1, an electrical connection box 1 is mounted on a truck in a state of being exposed to outside (which is an example). Specifically, the electrical connection box 1 is mounted between a cabin and a loading platform of the truck (which is an example). Such an electrical connection box 1 includes an electronic component block (no shown) and a housing that accommodates the electronic component block. The electrical connection box 1 is configured such that a wire harness 3 is drawn into a housing 2. The wire harness 3 is routed in an automobile with an electrical connection box 1 at a predetermined position such as at a terminal thereof.

The electrical connection box 1 has a structure capable of enhancing waterproofness of an engagement portion between a frame 4 and a lower cover 7 described below.

<Electronic Component Block that is not Shown>

In FIG. 1, the electronic component block accommodated in the housing 2 is provided as a member in which a plurality of electronic components are assembled. The electronic component block is provided as a member in which the electronic components are connected to a predetermined circuit. Specifically, the electronic component block is provided as a member in which a relay is assembled to a resin relay assembling portion (reference numeral omitted), and a fuse is assembled to a resin fuse assembling portion (reference numeral omitted) (the above configuration of the electronic component block is an example). The electronic component block described above is of a cassette type, and is detachably assembled to the frame 4 described below. The name of the electronic component block may be replaced with a cassette block.

<Configuration of Housing 2>

In FIG. 1, the housing 2 is a combination of insulating resin members, and includes the frame 4 to which the electronic component block (not shown) is detachably assembled, an upper cover 5 that covers an upper opening of the frame 4, and the lower cover 7 that covers a lower opening 6 of the frame 4 (see FIGS. 2 and 3). A plurality of fixed leg portions 8 are formed in the housing 2. An insertion portion 9 into which the wire harness 3 is inserted (drawn) is also formed in the housing 2.

<Configuration of Frame 4 and Frame Peripheral Wall 10>

In FIGS. 1 and 2, the frame 4 is a resin molded article, and is formed in an illustrated shape to have a frame peripheral wall 10, a fixed base 11 provided on one side portion of the frame peripheral wall 10, and the fixed leg portions 8 provided on the fixed base 11. The frame peripheral wall 10 extends in the upper-lower direction of the arrows P, has an outer peripheral wall 12 having this height and an inner peripheral wall 13 (see FIG. 5) disposed inside the outer peripheral wall 12, and is formed in a frame-shaped portion that is opened upward and downward. The frame peripheral wall 10 is formed of a double wall structure. The fixed base 11 is formed on one side portion of the frame peripheral wall 10 as described above. A plurality of frame side lock portions 15 that lock cover side lock portions 14 of the upper cover 5 are formed on an upper side of the other side portion opposite to the one side portion. An attachment portion for the electronic component block (not shown) is formed on an inner surface of the outer peripheral wall 12. A plurality of frame side lock portions 16 (lock portions) that lock cover side lock portions 28 described below of the lower cover 7 are formed on a lower side of the frame peripheral wall 10. In addition, a frame side seam 17 is formed on the lower side of the frame peripheral wall 10.

<Frame Side Seam 17>

In FIGS. 2 to 8, the frame side seam 17 is formed in a portion that ensures waterproofness between the frame side seam 17 and a cover side seam 29 described below of the lower cover 7. When the lower cover 7 is attached to the frame 4, the frame side seam 17 is entirely formed in a concave portion where the cover side seam 29 is inserted and engaged to the frame side seam 17. The frame side seam 17 is formed in an illustrated shape (the concave portion) so as to have a lower end 18 of the outer peripheral wall 12, a lower end 19 of the inner peripheral wall 13, and a gap 20 between the lower ends 18 and 19. The inner peripheral wall 13 is formed long such that the lower end 19 is positioned downward than the lower end 18 of the outer peripheral wall 12. The elongated portion constitutes the frame side seam 17. The outer peripheral wall 12 has a portion that forms a mating surface 38 described below. Specifically, an end surface 21 of the lower end 18 forms the mating surface 38. The inner side of the lower end 18 of the outer peripheral wall 12 is formed in a stepped shape. A surface of a step portion 22 in the stepped shape has the same function as that of the end surface 21. Reference numeral 23 in FIGS. 7 and 8 indicate a connection wall that connects the outer peripheral wall 12 and the inner peripheral wall 13.

In a position where the frame side seam 17 is provided, two frame side lock portions 16 (lock portions) are arranged at intervals on an outer surface on a front side (a front surface side) of the outer peripheral wall 12 (the number is an example). A flat surface is formed next to the frame side lock portions 16. A second shield wall 40 described below of the lower cover 7 faces the flat surface. As will be understood from the following description of the lower cover 7, since the second shield wall 40 and a first shield wall 39 described below of the lower cover 7 are provided, waterproofness between the frame side seam 17 and the cover side seam 29 described below is further enhanced.

<Upper Cover 5>

In FIG. 1, the upper cover 5 is a resin molded article that covers the upper opening of the frame 4 as described above, and is formed in an illustrated shape to have a ceiling wall 24, a cover peripheral wall 25 continuous with a peripheral edge of the ceiling wall 24, and a plurality of cover side lock portions 14 provided on the cover peripheral wall 25.

<Lower Cover 7>

In FIGS. 1 and 2, the lower cover 7 is a resin molded article that covering the lower opening 6 of the frame 4 as described above, and is formed in an illustrated shape to have a bottom wall 26, a cover peripheral wall 27 continuous with a peripheral edge of the bottom wall 26, a plurality of cover side lock portions 28 provided on the cover peripheral wall 27; a cover side seam 29 engaged with the frame side seam 17 of the frame peripheral wall 10, and a plurality of waterproof structures 30 including characteristic portions of the present invention. The fixed leg portion 8 and the insertion portion 9 are formed in the bottom wall 26. The insertion portion 9 is formed in a portion into which the wire harness 3 is inserted (drawn) as described above. In addition, the insertion portion 9 also has a function as a drain hole for draining moisture that has reached the bottom wall 26 through the double wall structure (Drainage is performed through the wire harness 3. In addition, a dedicated drain hole may be formed in the bottom wall 26).

<Cover Side Seam 29>

In FIGS. 2 to 8, the cover side seam 29 is formed in a portion that ensures waterproofness between the cover side seam 29 and the frame side seam 17 of the frame peripheral wall 10 as described above. The cover side seam 29 is formed in an illustrated shape to have a convex portion inserted into the concave frame side seam 17, and a seam main body 31. The convex portion constituting the cover side seam 29 is formed at an upper end 32 of the cover peripheral wall 27. The seam main body 31 is formed in an illustrated shape to have a main body first wall 33 protruding outward from an outer surface of the cover peripheral wall 27 (in a direction orthogonal to the outer surface) and a body second wall 34 extending downward from a protruding tip end of the main body first wall 33. The main body second wall 34 is formed in a stepped shape on a base end side (a side continuous with the main body first wall 33). A surface 36 of a step portion 35 in the stepped shape is a portion that forms the mating surface 38 described below. In addition, reference numeral 37 in the main body first wall 33 indicates a receiving surface that receives the frame side seam 17. The receiving surface 37 also has the same function as the surface 36 of the step portion 35.

<Mating Surface 38>

In FIGS. 5 to 8, the mating surface 38 is a surface formed when the frame side seam 17 and the cover side seam 29 are engaged. Specifically, the mating surface 38 is formed when the end surface 21 of the lower end 18 of the outer peripheral wall 12 and the surface 36 of the step portion 35 of the main body second wall 34 come into contact with each other, or when the end surface 21 and the surface 36 face each other with a small gap therebetween. When the lower cover 7 is assembled to the frame 4, the mating surface 38 is formed.

<Waterproof Structure 30>

In FIGS. 1 to 8, waterproof structures 30 are formed at a plurality of locations as a structural portion that prevents moisture from entering from the mating surface 38. The waterproof structure 30 is disposed and formed adjacent to a lock portion of the frame side lock portion 16 and the cover side lock portion 28. In the present embodiment, three waterproof structures 30 are formed on an outer surface on a front side of the cover peripheral wall 27 on the assumption that high pressure moisture is applied from a front side (the front) or an obliquely lower side of the electrical connection box 1. The waterproof structure 30 includes the first shield wall 39, the second shield wall 40 and a moisture removal space 41.

<First Shield Wall 39>

In FIG. 3 to 8, the first shield wall 39 is formed as a shield wall that blocks high pressure moisture from the obliquely lower side. The first shield wall 39 is formed as a wall protruding shortly outward from a lower end of the main body second wall 34 of the seam main body 31 at the cover side seam 29. The first shield wall 39 is formed in a shape having no hole in a wall thickness direction. Three reinforcement ribs 42 are formed in the first shield wall 39. The three reinforcement ribs 42 are respectively disposed at left and right ends and a center of the first shield wall 39. The three reinforcement ribs 42 are formed in portions that support the first shield wall 39 from a lower side.

<Second Shield Wall 40>

In FIGS. 3 to 8, the second shield wall 40 is formed as a shield wall that blocks high pressure moisture from the front side (the front). The second shield wall 40 is formed as a wall protruding from a protruding tip of the first shield wall toward a frame peripheral wall 10 side, that is, protruding upward longer than the first shield wall 39. The second shield wall 40 is formed so as to be located outward (forward) than the mating surface 38 between the frame side seam 17 and the cover side seam 29. The second shield wall 40 is formed such that a wall inner surface 43 thereof faces an outer surface of the frame peripheral wall 10. A reinforcement rib 44 is formed on the wall inner surface 43 of the second shield wall 40. The reinforcement rib 44 is formed as a portion that increases strength of the second shield wall 40. The reinforcement rib 44 is formed so as to extend in the upper-lower direction at a central position of the wall inner surface 43. The reinforcement rib 44 of the present embodiment is disposed and formed so as to substantially divide the moisture removal space 41 into two parts. The reinforcement rib 44 may be formed in any manner.

<Moisture Removal Space 41>

In FIGS. 3 to 8, the moisture removal space 41 is formed as a space portion generated between a position of the mating surface 38 and the first shield wall 39. The moisture removal space 41 is formed to remove moisture below the position of the mating surface 38 and prevent the moisture from entering directly from the mating surface 38. The moisture removal space 41 is formed in a shape having a groove below the position of the mating surface 38. A pocket-shaped portion may be formed below the position of the mating surface 38. In this case, since moisture remains below the mating surface 38, the moisture that has fallen here is accumulated and the momentum thereof is weakened. Even if moisture bounces back to the position of the mating surface 38, there is no momentum that the moisture enters from the mating surface 38. A drain portion 45 communicating with outside is formed in the moisture removal space 41 shown in the present embodiment. The moisture that has fallen into the moisture removal space 41 is drained to the outside through the drain portion 45. If an inclined surface 46 inclined toward the drain portion 45 as shown in FIG. 9 is formed in the first shield wall 39, drainage performance is of course improved.

Effects

As described above with reference to FIGS. 1 to 9, according to the housing 2 in the embodiment of the present invention, when moisture is applied, for example, at a high pressure, from the lower side toward the engagement portion (the mating surface 38) between the frame side seam 17 of the frame 4 and the cover side seam 29 of the lower cover 7, the moisture can be blocked by the first shield wall 39. When moisture is applied in the same manner from a front surface side of the frame 4, the moisture can be blocked by the second shield wall 40. On the other hand, when moisture is applied in the same manner from an upper side of the frame 4, the moisture may enter a gap between the outer surface of the frame peripheral wall 10 and the wall inner surface 43 of the second shield wall 40. However, the moisture that enters passes the engagement portion (the mating surface 38) and falls to the moisture removal space 41. By adopting a structure in which moisture falls to the moisture removal space 41, the momentum of the moisture can be weakened. In addition, the moisture is difficult to enter the engagement portion (the mating surface 38) during falling. Therefore, according to the housing 2, waterproofness can be enhanced as compared with the example in related art.

According to the electrical connection box 1 or the wire harness 3 according to the embodiment of the present invention, a better product can be provided due to the housing 2 having the above effect.

It goes without saying that the present invention can be variously modified without departing from the spirit of the present invention.

What is claimed is:

1. A housing comprising: a frame having a frame peripheral wall which forms a lower opening, wherein the frame peripheral wall has a frame side seam formed at a lower opening side of the frame peripheral wall; and a lower cover having a cover side seam which is engaged with the frame side seam, and configured to cover the lower opening, wherein the lower cover has a first shield wall protruding outward from the cover side seam, and a second shield wall protruding longer than the first shield wall from the first shield wall toward an upper side of the frame; wherein the second shield wall is located outward than a mating surface between the frame side seam and the cover side seam, a base portion of the second shield wall is connected to the first shield wall, a wall inner surface of the second shield wall is formed to face an outer surface of the frame peripheral wall, and an entire of the second shield wall from its distal end portion to the base portion is located outward than and spaced away from the outer surface of the frame peripheral wall; and wherein a groove-shaped or pocket-shaped moisture removal space is formed between the mating surface and the first shield wall; wherein the first shield wall has an inclined surface inclined towards a drain portion; and a reinforcement rib formed on the inner wall surface of the second shield wall extending in an upper-lower direction at a central position of the wall inner surface.

2. The housing according to claim 1, wherein the moisture removal space has the drain portion communicating with outside of the housing.

3. The housing according to claim 1,
wherein a reinforcement rib protruding in a direction in which a thickness of the second shield wall is increased and extending in an extending direction of the second shield wall is formed on the wall inner surface of the second shield wall.

4. The housing according to claim 1,
wherein a lock portion that fits the frame and the lower cover is disposed in vicinity of a portion where the first shield wall, the second shield wall and the moisture removal space are provided.

5. An electrical connection box comprising:
an electronic component block in which a plurality of electronic components are assembled; and
the housing according to claim 1 that accommodates the electronic component block.

6. A wire harness comprising:
a wire harness body whose end portion is connected to the electrical connection box according to claim 5,
wherein the wire harness body is routed in an automobile.

7. The housing according to claim 1,
wherein the second shield wall protrudes, in a direction toward the upper side of the frame, beyond an end surface of a lower end of the frame peripheral wall.

* * * * *